(12) United States Patent
Haze

(10) Patent No.: US 7,600,315 B2
(45) Date of Patent: Oct. 13, 2009

(54) METHOD OF MANUFACTURING PRINTED CIRCUIT BOARD

(75) Inventor: Takayuki Haze, Kyoto (JP)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 132 days.

(21) Appl. No.: 12/003,768

(22) Filed: Dec. 31, 2007

(65) Prior Publication Data

US 2008/0184558 A1  Aug. 7, 2008

(30) Foreign Application Priority Data

Feb. 7, 2007  (KR)  ............. 10-2007-0012745

(51) Int. Cl.
*H05K 3/22* (2006.01)

(52) U.S. Cl. ............... 29/846; 29/830; 29/831; 29/852; 29/842; 148/432; 420/473

(58) Field of Classification Search .......... 29/847, 29/846, 832, 831, 830, 856, 852; 148/432; 430/319

See application file for complete search history.

(56) References Cited

U.S. PATENT DOCUMENTS

| | | | |
|---|---|---|---|
| 6,749,699 B2* | 6/2004 | Bogel et al. | 148/432 |
| 2004/0091821 A1* | 5/2004 | Appelt et al. | 430/319 |
| 2005/0028363 A1* | 2/2005 | Khandros | 29/857 |
| 2006/0012028 A1* | 1/2006 | Usui et al. | 257/700 |
| 2007/0261234 A1* | 11/2007 | Song et al. | 29/829 |

\* cited by examiner

*Primary Examiner*—Derris H Banks
*Assistant Examiner*—Dan D Le

(57) ABSTRACT

This invention relates to a method of manufacturing a printed circuit board, in which a dummy metal frame enclosing the outer periphery of a product part is formed, thus simultaneously assuring the rigidity of the printed circuit board and minimizing the warping thereof thanks to the dummy metal frame left in place on a finished product, thereby realizing a structure compatible with conventional flip chip mounting lines.

9 Claims, 7 Drawing Sheets

METHOD OF MANUFACTURING PRINTED CIRCUIT BOARD

CROSS REFERENCE TO RELATED APPLICATION

This application claims the benefit of Korean Patent Application No. 10-2007-0012745, filed on Feb. 7, 2007, entitled "Method for manufacturing printed circuit board", which is hereby incorporated by reference in its entirety into this application.

BACKGROUND OF THE INVENTION

1. Field of the Invention

The present invention relates, in general, to a method of manufacturing a printed circuit board (PCB). More particularly, the present invention relates to a method of manufacturing a PCB, in which a dummy metal frame enclosing the outer periphery of a product part is left in place until the completion of a product, so that, during the formation of circuits, the rigidity of the PCB is assured and the generation of defects due to warping is minimized.

2. Description of the Related Art

In order for technology to keep up with the trend of increasing the signal transmission speed and the density of semiconductor chips, the demand for flip chip mounting, by which a semiconductor is directly mounted on a substrate, is increasing, replacing conventional CSP mounting and wire bonding mounting. Although flip chip mounting requires a highly reliable substrate having high density, an increase in the specification of the substrate in proportion to the increase in the density of the semiconductor is almost impossible to achieve in practice. Thus, there is an urgent need for the development of next-generation techniques for promoting flip chip mounting in the future.

The specification required for a flip chip mounting substrate is closely related to the specification of a semiconductor and requirements of high speed and high degree in electronic markets, and there are many goals to be realized, including circuit fineness, good electrical properties, high reliability, fast signal transmission, and high functionality. However, high performance of semiconductors results in heat generation, which is regarded as a big mechanical problem. To solve this, attempts to improve performance using multi-core architecture have been made, in place of a conventional approach of increasing the clock speed. As the results thereof, signal I/O is greatly increased, and hence, there is a need to remarkably increase the circuit density of a substrate for mounting a semiconductor. Further, with the aim of mitigating the heat generation, there is an increasing need to limit impedance in a substrate on which a semiconductor is mounted in order to minimize power loss. Accordingly, for the specification required for the substrate described above, the development of elementary techniques for realizing fine circuits, fine pitch bumps, fine pitch stacked vias, and low impedance, and the development of novel processes and novel material for inexpensive fabrication are required.

In this regard, the process of manufacturing a PCB according to a conventional technique is sequentially illustrated in FIGS. 3A to 3L, and is described below.

A resin substrate 301 having copper foil layers 302 formed on both surfaces thereof is subjected to half-etching, thus decreasing the thickness of the copper foil layers 302, after which through holes 303 are formed therein by means of typical etching and drilling (FIGS. 3A to 3C). Subsequently, an electroless copper plating layer 304 and a copper electroplating layer 305 are formed on the substrate having the through holes 303 (FIGS. 3D and 3E). The through holes 303 are filled with a conductive paste 306 (FIG. 3F), and then an inner circuit pattern is formed using patterning (FIG. 3G). Next, insulating layers 307 and via holes 308 are sequentially formed (FIGS. 3H and 3I), and then an outer circuit pattern is formed (FIG. 3J). Subsequently, solder resist layers 310 are formed, and then openings are formed in the solder resist layers 310 through a solder opening process, thus allowing soldering pads 309 to be exposed. Then, solder balls 311 are mounted on the exposed soldering pads 309, after which contour routing is conducted, thereby forming unit PCBs (FIGS. 3K and 3L).

According to the conventional method of manufacturing the flip chip mounting substrate, the core material having a thickness of from 0.4 mm to 0.8 mm is processed to form through holes and circuits, after which, on both sides of the core thus processed, acting as a base plate, formation of insulating layers, via processing, copper plating, and circuit formation are repeatedly conducted, thus building up the layers, thereby manufacturing a substrate having a high density structure. However, in the case where a coreless substrate, such as an ultra-thin substrate, is manufactured using the conventional method, the following two problems are incurred.

First, when a substrate having low rigidity without a base plate is formed into a built-up structure by repeating the formation of insulating layers, interlayer connection processing, and the formation of circuits using conventional equipment, many process defects, including the dropping of the substrate from a horizontal conveying device, interruption of conveyance, overlapping of substrates in basket-type treatment, and damage to the substrate during handling, are generated. Second, attributable to the substrate having low rigidity without the base plate, a finished substrate may easily warp, thus making it impossible to fulfill the demands of consumers.

SUMMARY OF THE INVENTION

Leading to the present invention, intensive and extensive research into methods of manufacturing PCBs, aiming to solve the problems encountered in the related art, resulted in the finding that a dummy metal frame enclosing the outer periphery of a product part may be formed, thereby simultaneously assuring the rigidity of a PCB and minimizing the warping thereof, thanks to the dummy metal frame left in place on a finished product.

Accordingly, the present invention provides a method of manufacturing a PCB for flip chip mounting, having a coreless structure for minimizing the impedance of a substrate for mounting a semiconductor.

In addition, the present invention provides a method of manufacturing a PCB, which facilitates the mounting of a semiconductor on a coreless PCB.

In addition, the present invention provides a method of manufacturing a PCB, which is capable of assuring the rigidity of the PCB and minimizing the warping thereof in the formation of circuits.

According to the present invention, a method of manufacturing a PCB may include (a) providing a work substrate having a resin substrate and metal plates having rigidity equal to or higher than 100 GPa and formed on both surfaces of the resin substrate; (b) removing an inner portion of each of the metal plates, corresponding to a product part which enables a plurality of unit PCBs to be integrally connected to each other, through etching, thus simultaneously exposing the resin substrate of the product part and forming a dummy metal frame enclosing the outer periphery of the product part; (c) forming through holes in the resin substrate of the product part; (d) forming an inner circuit pattern on the resin substrate of the product part having the through holes; (e) forming an insulating layer on the product part having the inner circuit pattern; (f) forming via holes in the insulating layer; (g) forming an outer circuit pattern on the insulating layer having the via holes; and (h) forming a solder resist layer on the product part having the outer circuit pattern, and then exposing the portions of the circuit pattern, corresponding to a bump pad for semiconductor mounting and a soldering pad for connection with an external component, through solder opening.

Depending on need, the (e) to the (g) may be sequentially conducted several times and then the (h) may be conducted.

When two or more product parts are present on the work substrate, the method may further include subjecting each of the product parts to contour routing so that the dummy metal frame enclosing the outer periphery of each of the product parts is left in place.

In the present invention, the method may further include mounting a solder ball on the soldering pad of the product part and then cutting the product part into the unit PCBs. Alternatively, the method may further include cutting the product part into the unit PCBs and then mounting a solder ball on the soldering pad of each of the unit PCBs.

The metal for the metal plates is preferably selected from the group consisting of Ni, Cu, Fe, and Ti alloys, and combinations thereof.

The resin substrate may be an ultra-thin substrate having a thickness less than or equal to 0.4 mm.

DESCRIPTION OF THE PREFERRED EMBODIMENTS

Hereinafter, a detailed description will be given of the present invention, with reference to the appended drawings.

FIGS. 1A to 1J and FIG. 2 schematically and sequentially illustrate the process of manufacturing a PCB according to the present invention.

Figure 1A:
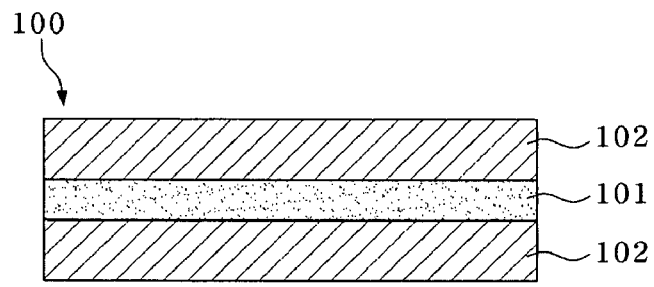
FIGS. 1A to 1J are schematic sectional views sequentially illustrating the process of manufacturing a PCB, according to the present invention.
Figure 2:
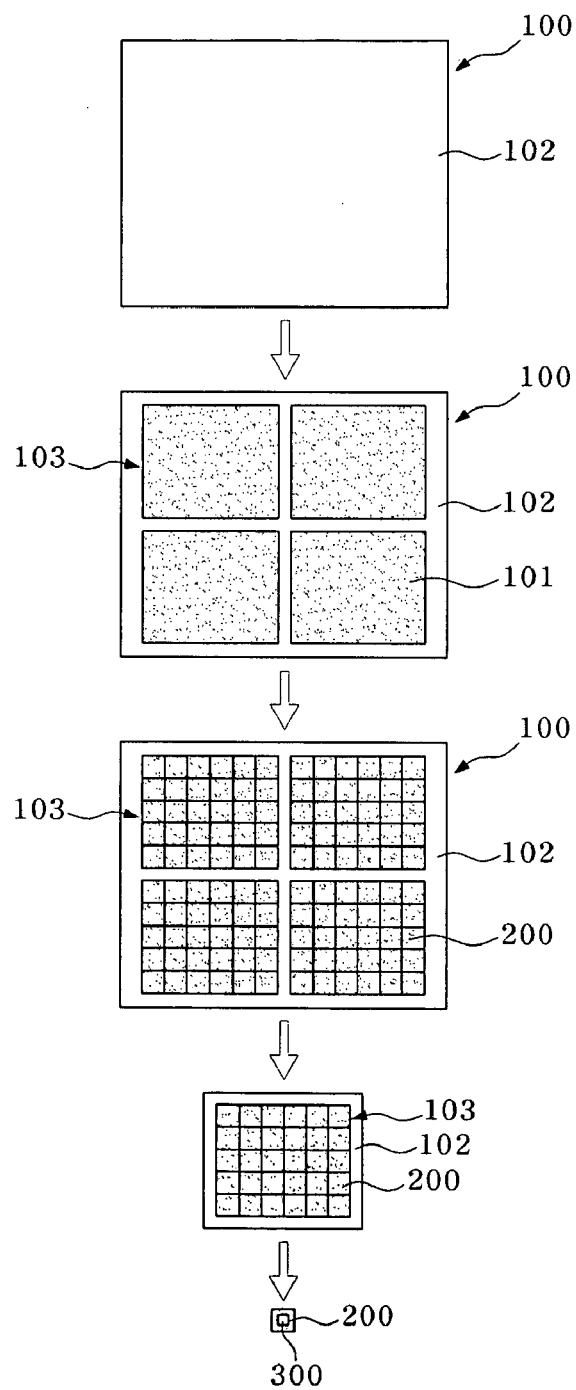
FIG. 2 is schematic top plan views sequentially illustrating the process of manufacturing a PCB, according to the present invention.
Figure 3A:
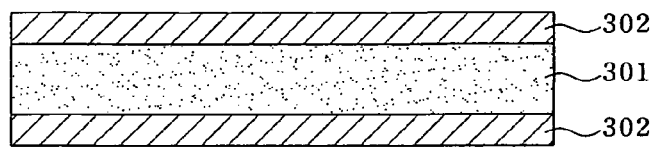
FIGS. 3A to 3L are schematic sectional views sequentially illustrating the process of manufacturing a PCB, according to a conventional technique.
Figure 3B:
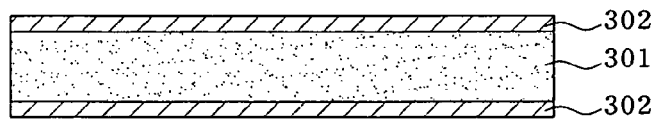
Figure 3C:
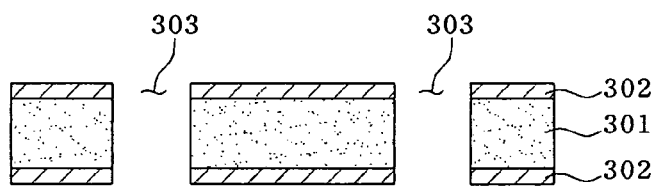
Figure 3D:
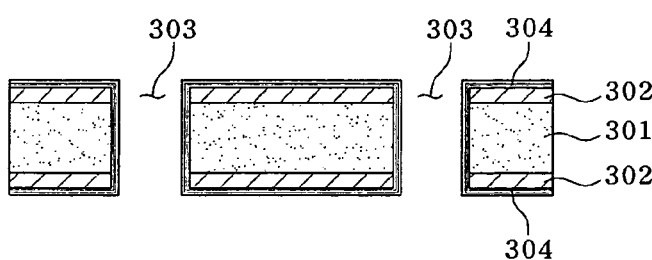
Figure 3E:
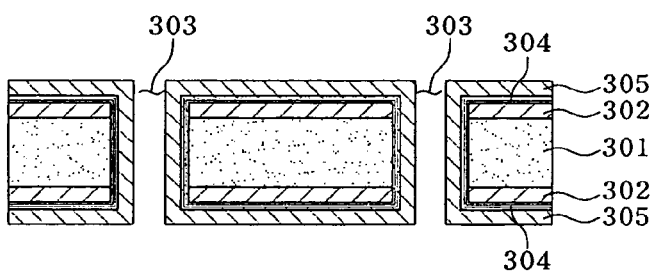
Figure 3F:
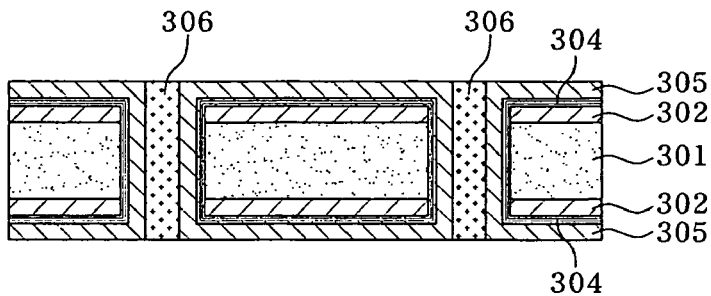
Figure 3G:
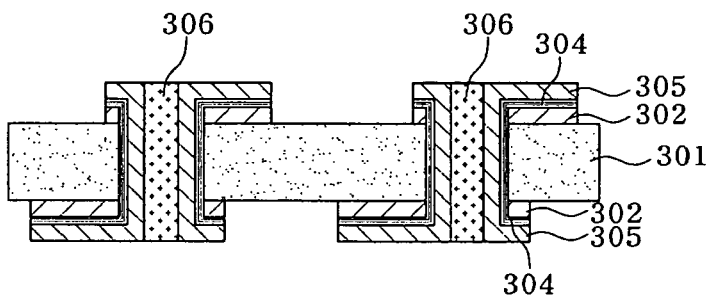
Figure 3H:
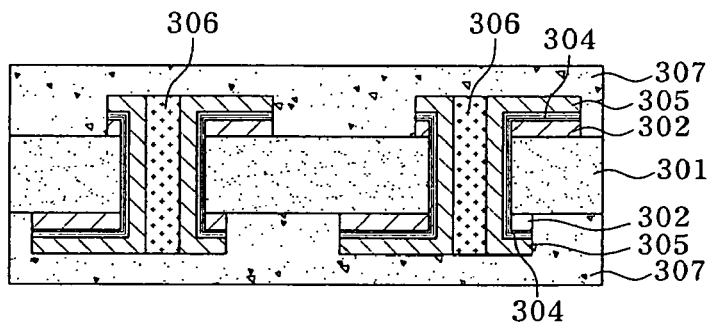
Figure 3I:
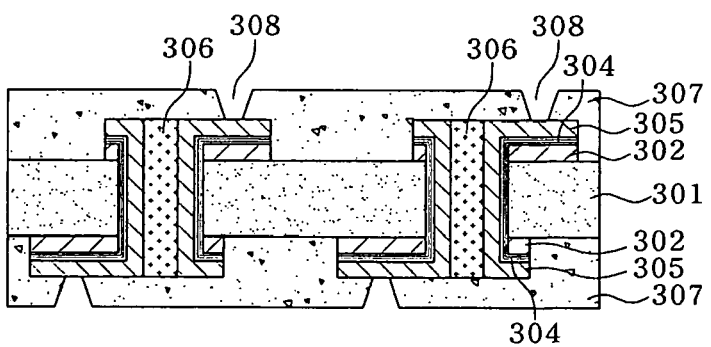
Figure 3J:
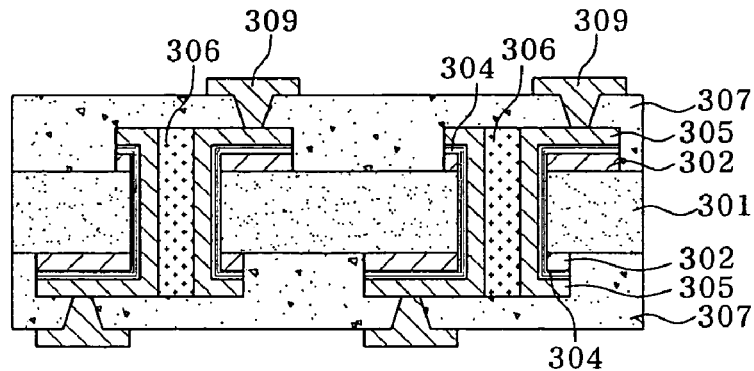
Figure 3K:
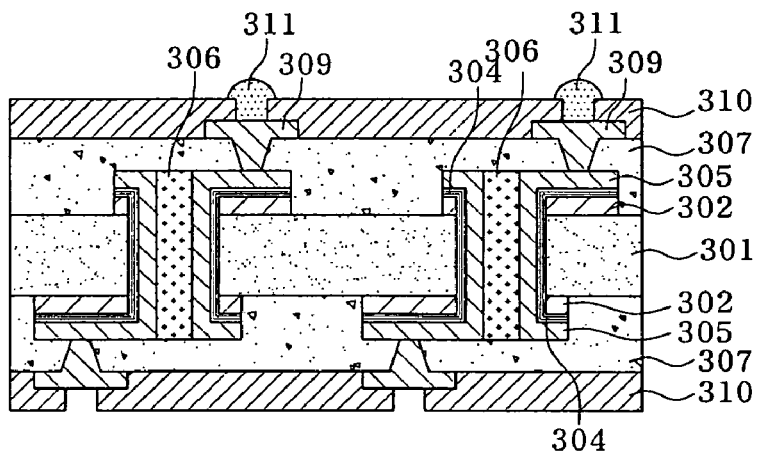
Figure 3L:
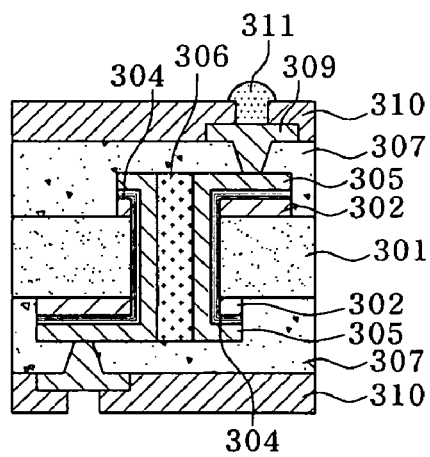

According to the present invention, a work substrate 100, having a resin substrate 101 and metal plates 102 having rigidity equal to or higher than 100 GPa on both surfaces thereof, is prepared (FIG. 1A and the first figure of FIG. 2). The type and thickness of the resin substrate 101 are not particularly limited so long as they are typical in the art. In the present invention, even when an ultra-thin substrate having a thickness less than or equal to 0.4 mm is used, it is possible to assure the rigidity of a PCB and minimize the warping thereof, and thus the above substrate is compatible with conventional flip chip mounting lines. The use of metal plates 102, having rigidity equal to or higher than 100 GPa, and preferably 100~300 GPa, is suitable in terms of functionality and workability which are desired in the present invention.

The metal for the metal plates 102 is not particularly limited so long as it imparts the degree of rigidity noted above, and preferable examples thereof include Ni, Cu, Fe, and Ti alloys, and combinations thereof. The method of manufacturing the work substrate is not particularly limited so long as it is known in the art, and the thickness of the metal plates 102 formed on both surfaces of the resin substrate 101 may be appropriately controlled within a desired rigidity range depending on the types of metal actually used.

Figure 1B:
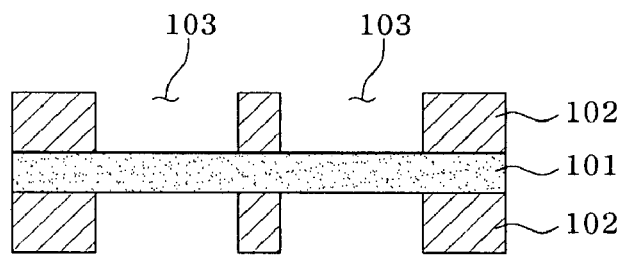
Figure 1C:
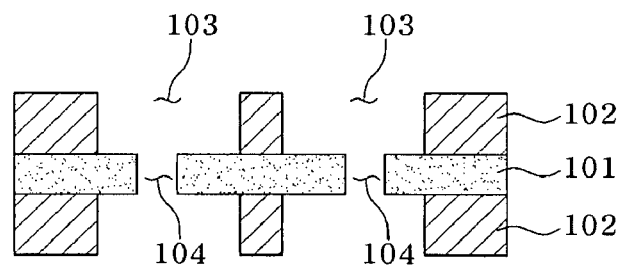

Subsequently, the inner portions of the metal plates 102, corresponding to product parts 103, each of which enables a plurality of unit PCBs to be integrally connected to each other, are removed through typical etching, so that the resin substrate 101 of the product parts 103 is exposed and the dummy metal frames 102 enclosing the outer peripheries of the product parts 103 are formed (FIG. 1B and the second figure of FIG. 2).

Figure 1D:
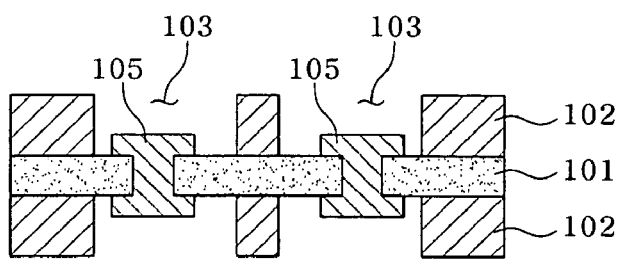

Next, the resin substrate 101 of the product parts 103 is subjected to typical etching and drilling, thus forming through holes 104 (FIG. 1C), after which an inner circuit pattern 105 is formed on the resin substrate 101 of the product parts 103 having the through holes 104 (FIG. 1D). As such, the inner circuit pattern 105 may be formed through electroless metal plating, metal electroplating, and patterning, using a semi-additive process, but the present invention is not particularly limited thereto.

Figure 1E:
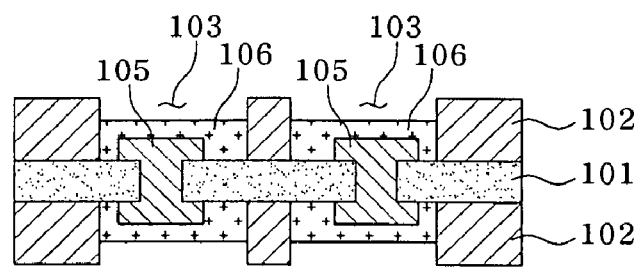
Figure 1F:
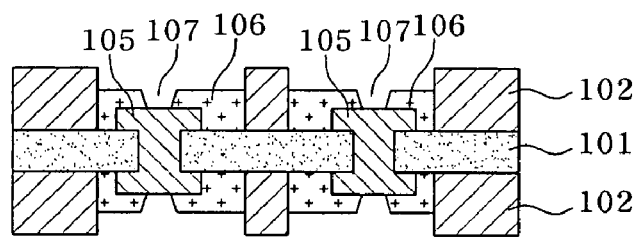
Figure 1G:
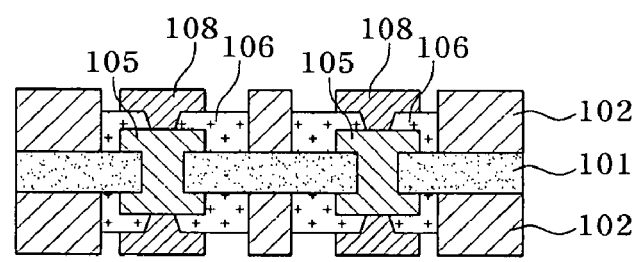

Subsequently, insulating layers 106 are formed on the product parts 103 having the inner circuit pattern 105 according to a typical build-up process, after which predetermined portions thereof are processed, thus forming via holes 107. Next, using electroless metal plating, metal electroplating, and patterning, an outer circuit pattern 108 is formed (FIGS. 1E to 1G). Depending on the need, the build-up process may be repeated several times in order to control the number of circuit layers, which will be apparent to those skilled in the art.

Figure 1H:
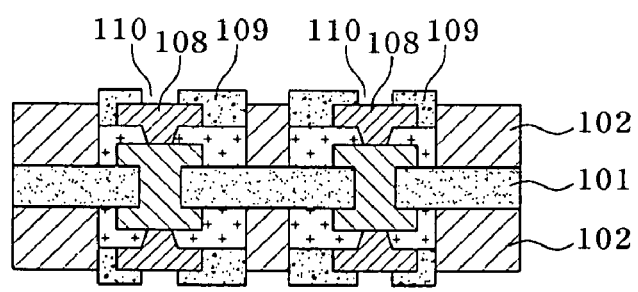

Next, solder resist layers 109 are formed on the product parts 103 having the outer circuit pattern 108, after which solder openings 110 are formed in the solder resist layers 109 through a solder opening process to thus expose the portions of the circuit pattern 108 corresponding to a bump pad for semiconductor mounting and a soldering pad for connection with an external component (FIG. 1H).

Figure 1I:
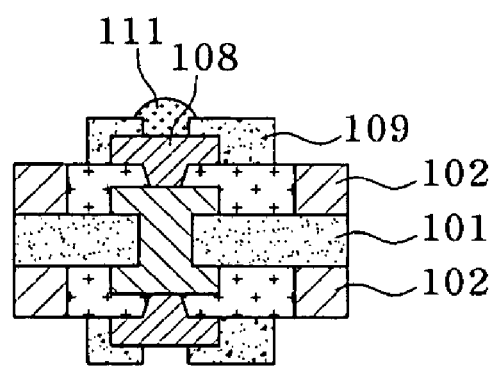

In the case where the number of product parts 103 thus obtained, which are present on the work substrate 100, is two or more, each of the product parts 103 is subjected to contour routing so that the dummy metal frame 102 enclosing the outer periphery of each of the product parts 103 is left in place (FIG. 1I and the fourth figure of FIG. 2). In this way, the metal frame 102 is left in place around the product part 103 until the completion of a product, thereby minimizing the generation of defects upon the formation of layers and circuits.

Figure 1J:
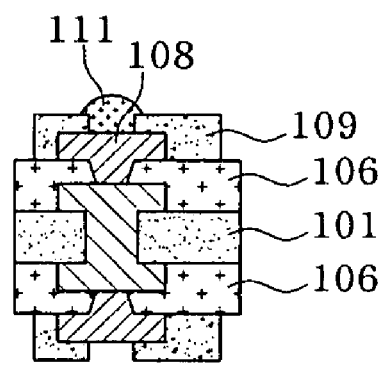

Before the product part 103, subjected to contour routing, is cut into unit PCBs 200, a solder ball 111 may be mounted on the soldering pad 108 of the product part 103, or alternatively, the product part 103 may be cut into the PCB units 200 and then a solder ball 111 may be mounted on the soldering pad 108 of the unit PCB 200 (FIG. 1J).

On the unit PCB 200 having the solder ball 111, the electronic component 300 may be surface mounted according to the purpose of the present invention (the last figure of FIG. 2).

As mentioned above, according to the present invention, the dummy metal frame 102 enclosing the outer periphery of the product part 103, which enables the plurality of unit PCBs 200 to be integrally connected to each other, is formed on the work substrate 100, and is then left in place until the completion of the manufacture of the unit PCBs 200, thereby assuring the rigidity of the PCB and minimizing the warping thereof. Hence, even in the case where an ultra-thin core substrate or a coreless substrate is manufactured, it is compatible with conventional flip chip mounting lines.

Although the preferred embodiments of the present invention, with regard to the method of manufacturing the PCB, have been disclosed for illustrative purposes, those skilled in the art will appreciate that various modifications, additions and substitutions are possible within the technical spirit of the invention.

As described hereinbefore, the present invention provides a method of manufacturing a PCB. In the present invention, a built-up substrate and a coreless substrate are manufactured using an ultra-thin core having a thickness less than or equal to 0.4 mm as a base plate in the same manner as in a conventional manufacturing line using a base plate having predetermined rigidity and a thickness of from 0.4 mm to 0.8 mm.

Further, because a metal frame for assuring rigidity is attached to a finished product, an ultra-thin substrate having low rigidity undergoes less warping and is also compatible with a mounting line using a base plate having predetermined rigidity and a thickness of from 0.4 mm to 0.8 mm.

Simple modifications, additions and substitutions fall within the scope of the present invention as defined in the accompanying claims.

What is claimed is:

1. A method of manufacturing a printed circuit board, comprising:
    (a) providing a work substrate having a resin substrate and metal plates having rigidity equal to or higher than 100 GPa and formed on both surfaces of the resin substrate;
    (b) removing an inner portion of each of the metal plates, corresponding to a product part which enables a plurality of unit printed circuit boards to be integrally connected to each other, through etching, thus simultaneously exposing the resin substrate of the product part and forming a dummy metal frame enclosing an outer periphery of the product part;
    (c) forming through holes in the resin substrate of the product part;
    (d) forming an inner circuit pattern on the resin substrate of the product part having the through holes;
    (e) forming an insulating layer on the product part having the inner circuit pattern;
    (f) forming via holes in the insulating layer;
    (g) forming an outer circuit pattern on the insulating layer having the via holes; and
    (h) forming a solder resist layer on the product part having the outer circuit pattern, and then exposing portions of the circuit pattern, corresponding to a bump pad for semiconductor mounting and a soldering pad for connection with an external component, through solder opening.

2. The method as set forth in claim 1, wherein the (e) to the (g) are sequentially performed several times and then the (h) is performed.

3. The method as set forth in claim 1, further comprising, when two or more product parts are present on the work substrate, subjecting each of the product parts to contour routing so that the dummy metal frame enclosing the outer periphery of each of the product parts is left in place.

4. The method as set forth in claim 1, further comprising mounting a solder ball on the soldering pad of the product part and then cutting the product part into the unit printed circuit boards.

5. The method as set forth in claim 3, further comprising mounting a solder ball on the soldering pad of the product part and then cutting the product part into the unit printed circuit boards.

6. The method as set forth in claim 1, further comprising cutting the product part into the unit printed circuit boards and then mounting a solder ball on the soldering pad of each of the unit printed circuit boards.

7. The method as set forth in claim 3, further comprising cutting the product part into the unit printed circuit boards and then mounting a solder ball on the soldering pad of each of the unit printed circuit boards.

8. The method as set forth in claim 1, wherein each of the metal plates comprises a metal selected from a group consisting of Ni, Cu, Fe, and Ti alloys, and combinations thereof.

9. The method as set forth in claim 1, wherein the resin substrate has a thickness less than or equal to 0.4 mm.

* * * * *